(12) United States Patent
del Puerto

(10) Patent No.: US 7,009,359 B2
(45) Date of Patent: Mar. 7, 2006

(54) FOAM CORE CHUCK FOR THE SCANNING STAGE OF A LITHOGRAPHY SYSTEM

(75) Inventor: Santiago E. del Puerto, Milton, NY (US)

(73) Assignee: ASML Holding N.V., Veldhoven (NL)

( * ) Notice: Subject to any disclaimer, the term of this patent is extended or adjusted under 35 U.S.C. 154(b) by 64 days.

(21) Appl. No.: 10/636,548

(22) Filed: Aug. 8, 2003

(65) Prior Publication Data

US 2005/0029981 A1   Feb. 10, 2005

(51) Int. Cl.
*B64C 17/06* (2006.01)
*G05B 19/18* (2006.01)
*G03B 27/62* (2006.01)

(52) U.S. Cl. .......... 318/649; 700/60; 355/75; 355/77

(58) Field of Classification Search .......... 310/12–14; 318/623, 649; 355/75, 77, 401, 402
See application file for complete search history.

(56) References Cited

U.S. PATENT DOCUMENTS

| | | | | |
|---|---|---|---|---|
| 5,524,502 A | * | 6/1996 | Osanai | 74/490.07 |
| 5,980,367 A | * | 11/1999 | Metcalf | 451/285 |
| 6,320,649 B1 | * | 11/2001 | Miyajima et al. | 355/72 |
| 6,480,369 B1 | * | 11/2002 | Kirschstein et al. | 361/234 |
| 6,504,162 B1 | * | 1/2003 | Binnard et al. | 250/492.2 |
| 6,625,372 B1 | * | 9/2003 | Flanders et al. | 385/134 |
| 6,683,433 B1 | * | 1/2004 | Lee | 318/649 |
| 6,686,991 B1 | * | 2/2004 | Binnard et al. | 355/72 |
| 6,750,625 B1 | * | 6/2004 | Binnard et al. | 318/592 |
| 6,756,751 B1 | * | 6/2004 | Hunter | 318/135 |
| 6,872,958 B1 | * | 3/2005 | Andeen et al. | 250/492.2 |
| 2003/0058425 A1 | * | 3/2003 | Watson et al. | 355/72 |

FOREIGN PATENT DOCUMENTS

JP   2005064507 A   *   3/2005

* cited by examiner

*Primary Examiner*—David Martin
*Assistant Examiner*—Patrick Miller
(74) *Attorney, Agent, or Firm*—Sterne, Kessler, Goldstein & Fox P.L.L.C.

(57) ABSTRACT

A foam core chuck for use in a scanning stage of a lithography system is disclosed. In accordance with an embodiment of the present invention, the lithography stage includes a frame and a chuck supported by the frame. The chuck has a foam core structure that is covered by a shell layer. An electromagnetic device for supporting and positioning the chuck is coupled to the stage. The electromagnetic device, for example an electromagnetic motor, is coupled to the stage such that at least one coil is coupled to the frame and at least one magnet is coupled to the foam core structure of the chuck. The foam core structure acts as a distributed flexure for the magnet.

24 Claims, 13 Drawing Sheets

SECTION A-A

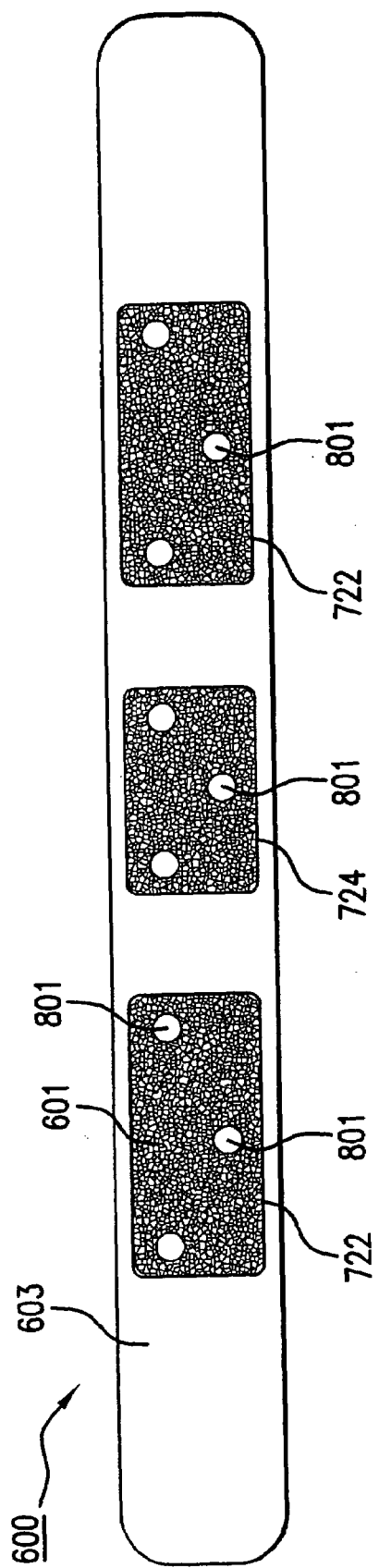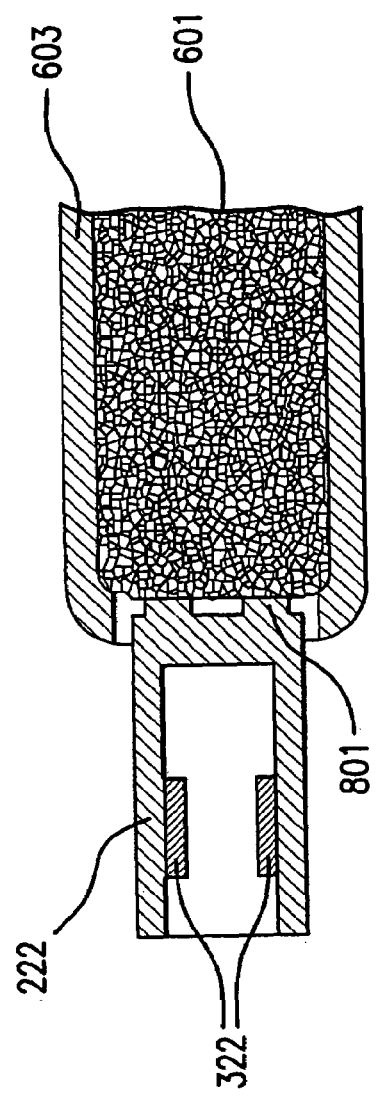
FIG.8A
FIG.8B

FOAM CORE CHUCK FOR THE SCANNING STAGE OF A LITHOGRAPHY SYSTEM

BACKGROUND OF THE INVENTION

1. Field of the Invention

The present invention is generally directed to semiconductor lithography tools. In particular, the present invention is directed to a foam core chuck for use in a scanning stage of a lithography system.

2. Background

In a lithography tool, a chuck is commonly used to hold and position an optical piece such as a reticle. Chucks are also used to hold workpieces such as the wafers upon which semiconductor devices are fabricated. As semiconductor devices grow increasingly smaller, the demands on lithography tools increase. Specifically, as chuck positioning tolerances decrease, demands on the lithography tool positioning control systems increase. For example, modem semiconductor geometries require chuck tracking and positioning to be accurate to 10 nanometers or better. In the past, chucks have been made from materials with relatively high thermal expansion coefficients, such as solid silicon carbide. These materials successfully met the less stringent requirements of their era. Conventionally, however, their use is disfavored.

The state of the art is to manufacture the precision portions of lithographic stages, such as wafer and reticle chucks, from ultra low expansion materials. Conventionally, ultra low expansion materials are used in order to keep the thermal strain low. Low thermal strain is desirable for improving the positioning accuracy of the chuck, which holds the reticle or wafer during scanning operations. This is because uncompensated changes in stage dimensions caused by temperature variations increase positioning uncertainty of the object being scanned. Low thermal strain is also desirable because it reduces thermal distortion of reticles and wafers by constraining them with chucks that expand less than the objects being constrained.

Nonetheless, there are several major problems associated with the material properties of ultra low expansion materials conventionally used for chucks in precision lithographic stages. First, they have mediocre specific stiffness. In other words, they are not very stiff for their density. Eigenfrequencies, or resonant frequencies, of these conventional materials are proportional to the square root of their specific stiffness. The lowest chuck resonant frequency, also known as its fundamental frequency, is a limiting factor in selecting the frequency, and thus bandwidth, of the control system for the lithography tool. This is because a control frequency at or above the chuck's fundamental resonant frequency may cause the chuck to vibrate. This compromises the dynamic performance of critical stage components, and adversely affects overall scanning performance and throughput.

Second, ultra low expansion materials have a very low thermal conductivity. As a result, localized heating can occur as heat is not evenly spread through the chuck. Poor heat dissipation limits the amount of heat that can be applied by motors, actuators and the like. Poor heat dissipation also tends to reduce system performance, as heavy cooling and heat shielding components are needed in other moving portions of the stage to prevent heat from affecting the chuck. For example, chucks are magnetically held and positioned within the stage of a modem lithography tool. Flexures are conventionally used to physically isolate the chuck body from the magnets to prevent heat transmitted to the magnets from being transmitted to the chuck body, and to allow for thermal expansion of the magnets. Three flexures are typically used to couple each magnet to the chuck itself. Each chuck typically has six magnets for a total of 18 flexures. Thus, their use also increases the weight of the chuck that needs to be supported and propelled by the positioning and control system.

Third, chucks made from ultra low expansion are very massive. In fact, the mass of the chuck is one of the main factors limiting the throughput of conventional lithography machines. Highly massive chuck blocks require large actuators and motors, which add on to the total moving mass of the chuck, thus aggravating the problem. Indeed, the excessive massiveness of the conventional chuck and its associated parts propagates outwards to the entire stage. The stage thus requires powerful drives, large balance masses and heavy frames to support them. The compounded outcome is that conventional lithography tools often use a stage weighing a couple thousand kilograms to propel and position a reticle weighing roughly 0.5 kilograms. Cost, which increases as a function of weight, is therefore very high.

The path to achieving high throughput at a reasonable cost thus starts with reducing the weight of the chuck. A lighter chuck would enable lighter components across the entire stage, significantly reducing costs and increasing throughput. It would be beneficial to accomplish this without sacrificing control system bandwidth, which is becoming increasingly important as semiconductor device sizes shrink into the nanometer realm. A lighter chuck with high specific stiffness is desired for making critical components of precision lithographic stages.

BRIEF SUMMARY OF THE INVENTION

The present invention is directed to a foam core chuck for use in a scanning stage of a lithography system. In accordance with an embodiment of the present invention, a lithography stage is disclosed. The lithography stage includes a frame and a chuck supported by the frame. The chuck has a foam core structure that is covered by a shell layer. An electromagnetic device for supporting and positioning the chuck is coupled to the stage. The electromagnetic device, for example an electromagnetic motor, is coupled to the stage such that at least one coil is coupled to the frame and at least one magnet is coupled to the foam core structure of the chuck. The foam core structure acts as a distributed flexure for the magnet.

The present invention is also directed to a method for making a foam core chuck. In accordance with one embodiment of the invention, a foam core structure is formed. Next, a shell layer is formed that covers the foam core structure. A region of the foam core structure is then exposed. Finally, a positioning apparatus is coupled to the exposed region of the foam core structure.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1 illustrates a typical projection optics system in which the invention is implemented.

FIGS. 2A–C illustrate a conventional frame and chuck arrangement.

FIGS. 3A and 3B further illustrate a conventional frame and chuck arrangement.

FIGS. 4A–C illustrate how X and Y motors of a positioning apparatus are conventionally coupled to a chuck.

FIGS. 7A–D illustrate how X, Y and Z motors of a positioning apparatus are coupled to the chuck according to an embodiment of the present invention.

FIGS. 8A–D illustrate how X, Y, and Z motors of a positioning apparatus are coupled to the chuck according to another embodiment of the present invention.

Figure 9A:
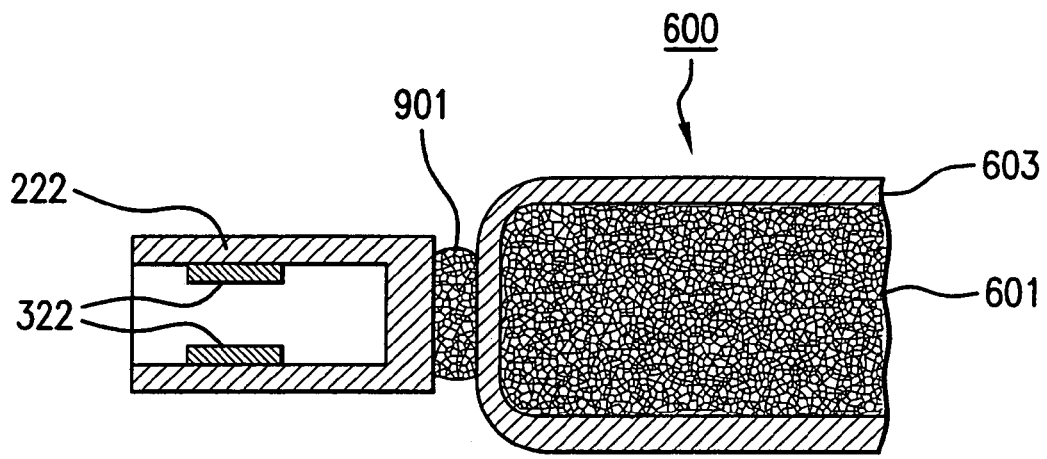
Figure 9B:
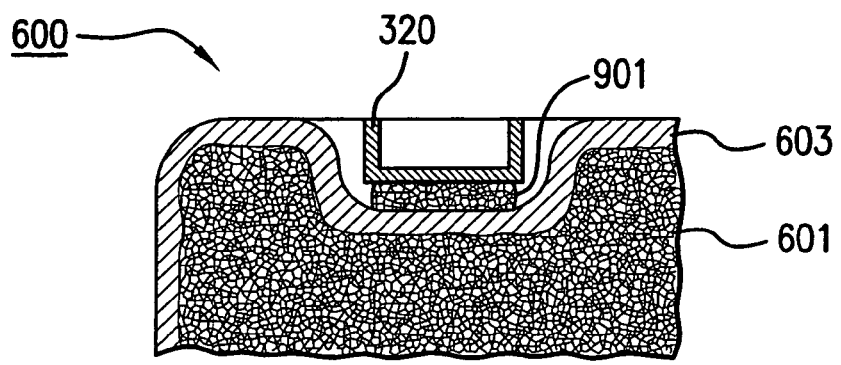
Figure 9C:
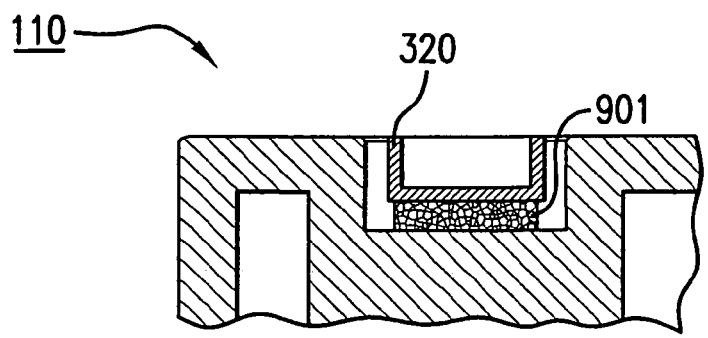

FIGS. 9A–C illustrate alternate embodiments for coupling positioning devices to the chuck of the present invention.

Figure 10:
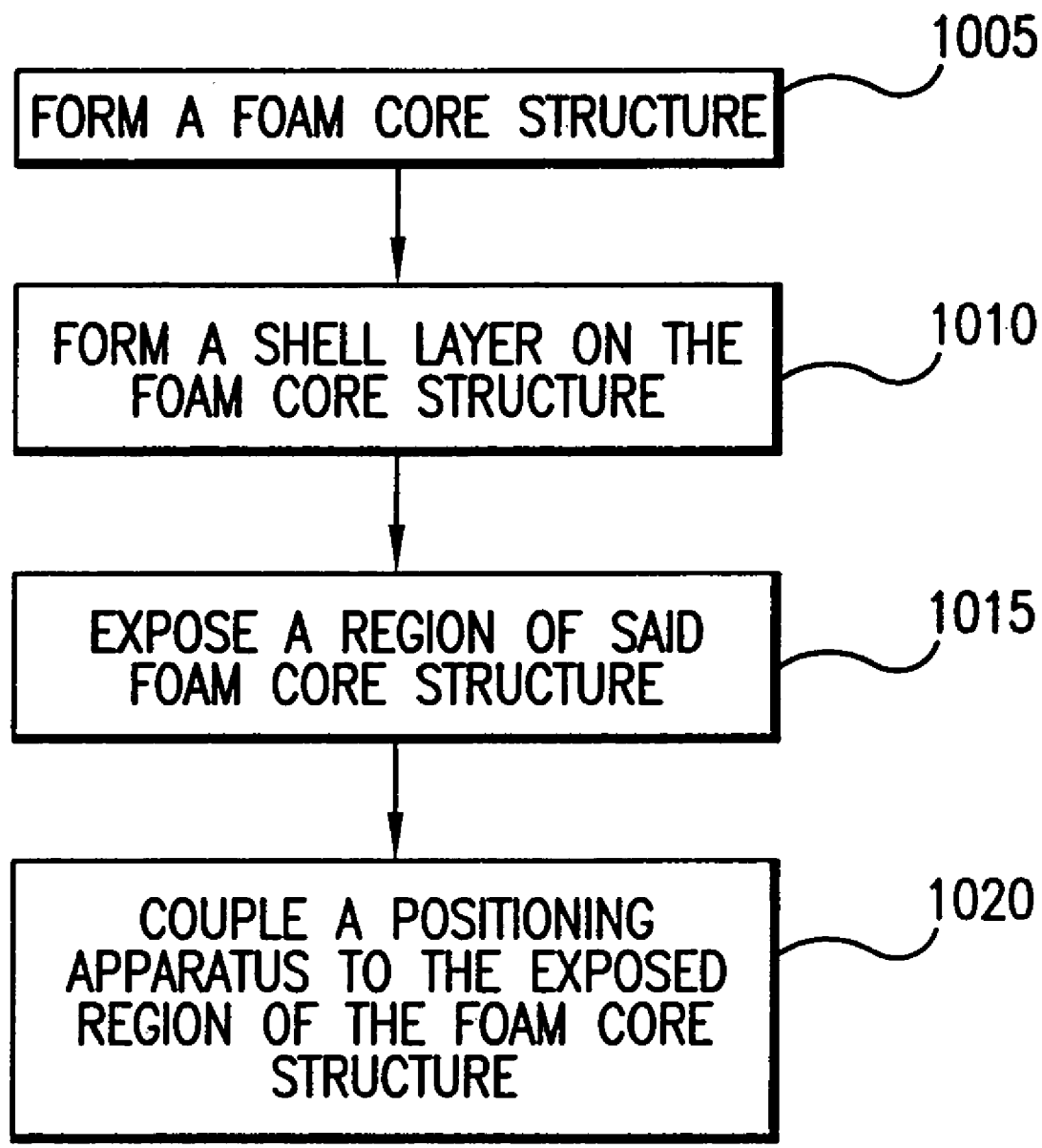

FIG. 10 is a flowchart illustrating a method for making a chuck according an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawings in which an element first appears is indicated by the leftmost digit(s) in the corresponding reference number.

DETAILED DESCRIPTION OF THE INVENTION

A. Overview

The present invention is directed to a foam core chuck for use in a scanning stage of a lithography system. Foam cores are very efficient structures, achieving a high stiffness per unit weight. Large mammal bones, helicopter rotor blades and surfboards are examples of foam core structures, each having a high level of stiffness for their relative weight.

In the present invention, the chuck has a lightweight, foamed material for its core structure. A shell layer covers the structure giving the chuck a high specific stiffness. The result is a stiff, lightweight, foam core chuck with, a high thermal conductivity and a low mass, when compared to conventional solutions. These physical properties confer a number of performance benefits over lithography tools using conventional chucks, which are typically massive and have low specific stiffness, low thermal conductivity, and extremely low coefficients of thermal expansion.

First, the lightweight chuck allows for weight and size reductions across the entire stage, which lowers costs, and increases product throughput. Additionally, the foam core structure acts as a distributed flexure for devices such as magnets that are coupled to it, thus eliminating the need for isolation flexures and further reducing the weight of the chuck. Second, selecting a chuck material with high specific stiffness allows the lithography control system to operate at a higher bandwidth, thus improving scanning performance. Third, a chuck material with high thermal conductivity produces a substantially isothermal chuck in which thermal strain can be easily measured or predicted, and thus compensated for if the positioning requirements so justify. Finally, the high surface area of the foam core makes it very easy to air cool, resulting in excellent temperature control of the chuck.

B. Example Environment

Figure 1:
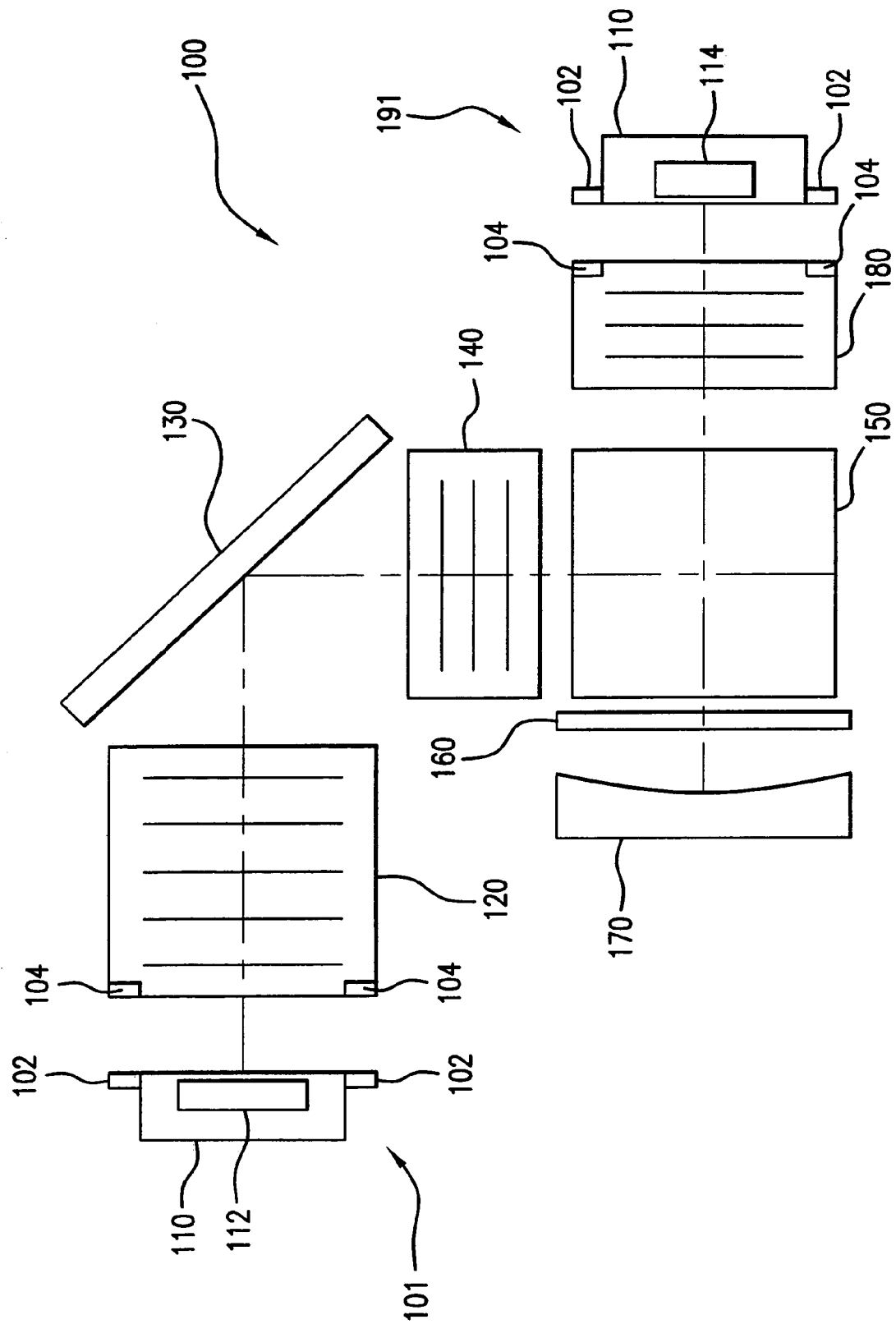

At the outset, it is helpful to describe the environment in which the invention may be used. FIG. 1 depicts an example environment in which a chuck 110 according to the present invention may be situated. Apparatus 100 is a conventional projection optics system as may exist in a scanning lithography tool. A reticle stage 101 is followed by a first lens group 120, a folding mirror 130, a second lens group 140, a beam splitter 150 and wave plate 160, a concave mirror 170, a third lens group 180, and a wafer stage 191. A chuck 110 is typically used, for example, to hold a reticle 112 in the reticle stage 101, or a wafer 114 in the wafer stage 191. Chucks may also be used to hold and position other objects, such as mirrors, within a lithography tool. Additionally, chucks according the present invention may be used in lithography tools that do not contain projection optics, such as a contact lithography tools, in maskless lithography tools, as well as in lithography tools with projection optics designs substantially different from this example.

The chuck 110 in FIG. 1 optionally includes a pair of encoder scales 102. Encoder scales 102 are attached along the side of the chuck 110. Lens group 120 has a pair of encoder heads 104 that correspond to the encoder scales 102 of the reticle stage 101. Lens group 180 has a pair of encoder heads 104 that correspond to the encoder scales 102 of the wafer stage. Chuck 110 usually includes encoder heads and scales for positioning. Optionally chuck 110 can also have an extra encoder or interferometer for measuring thermal expansion if the positioning requirements so justify. The implementation of thermal effects compensation is discussed in a related, copending application, U.S. app. Ser. No. 10/448,027, filed May 30, 2003, the contents of which is hereby incorporated by reference.

Lithography tools typically operate in a relatively thermally stable environment. A typical temperature range for a scanning lithography tool would be between 18 and 22 degrees Celsius. While under steady state scanning conditions, temperature in the chuck itself may vary about plus-or-minus one (+/−1) degree Celsius. Nonetheless, because of the extremely small tolerances of the precision stages (e.g., on the order of 10 nm), even small changes in temperature can cause unintended thermally induced changes in the dimensions of precision stages.

Lithography tools also require extremely quiet environments with respect to motion and vibration. For this reason, chucks are typically magnetically positioned and propelled within lithography tools. This places great demands on scanning and alignment control systems. The extent of control is directly related to system frequency, which is, in turn, directly related to the specific stiffness of the chuck.

Other orientations and physical arrangements of the elements will become apparent to a person having ordinary skill in the art and without departing from the spirit and scope of the present invention.

C. Conventional Apparatus for Supporting and Positioning a Chuck in a Lithography Stage.

Figure 2A:
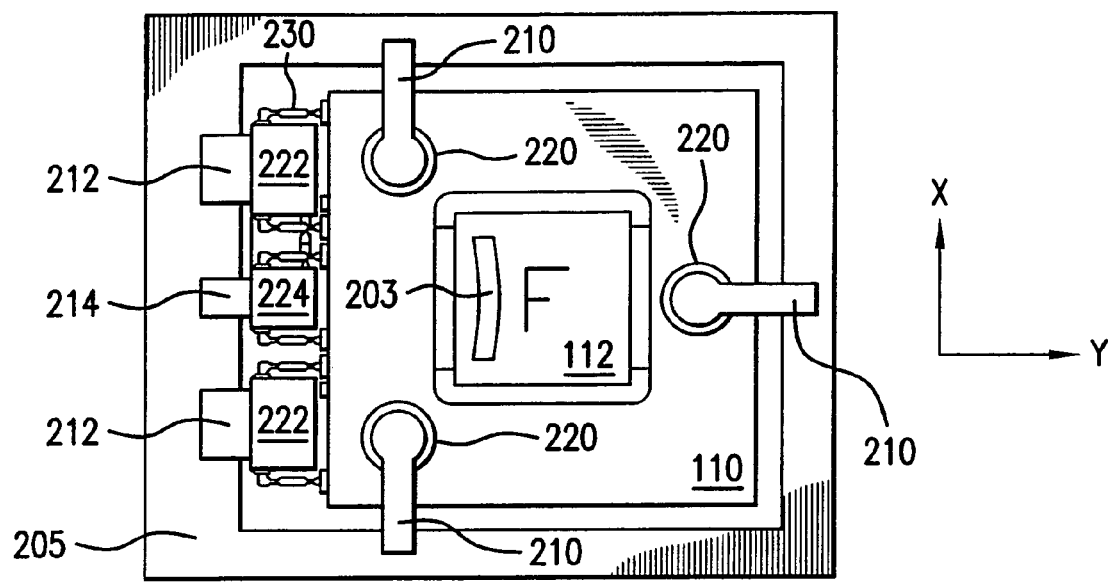
Figure 2B:
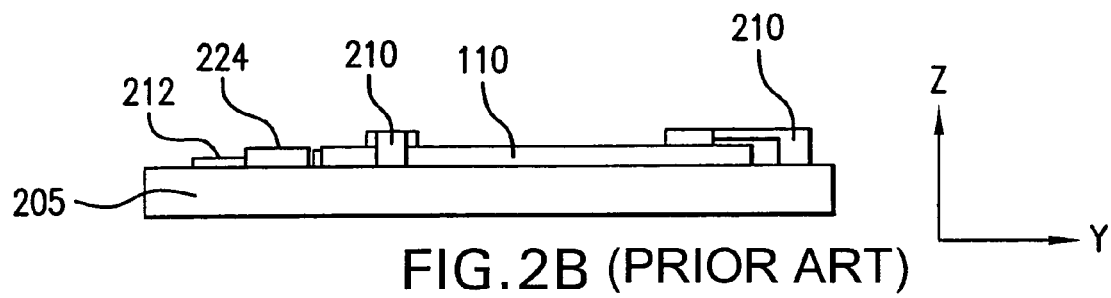
Figure 2C:
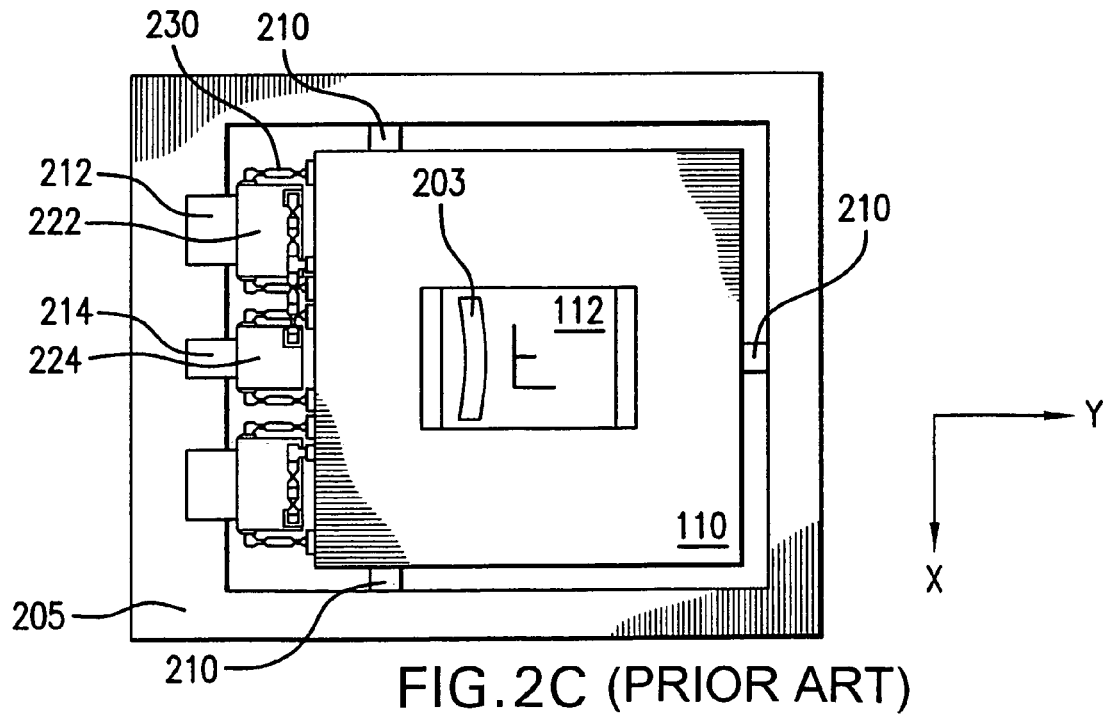

The features of the present invention are better understood when described in light of a conventional system for supporting and positioning a chuck 110. FIGS. 2A–C illustrate a conventional frame 205 and chuck 110 arrangement. The frame 205 and chuck 110 are coupled together by a positioning apparatus. Typically, the positioning apparatus is an electromagnetic device, such as an electromagnetic motor, but it is not limited to such an implementation. In an exemplary embodiment, chuck 110 is magnetically supported and positioned with in frame 205 by a plurality of electromagnetic motors. Typically, an electromagnetic motor comprises a magnet and an electric coil. The magnet has a fixed magnetic field, while the coil has a varying magnetic field whose strength depends on the amount of electricity passing through the coil. Thus, and electromagnetic motor can both support and propel the chuck 110. Electric coil arm 210 and magnet cup 220 form the support structure for Z direction electromagnetic motors supporting chuck 110. Electric coil plate 212 and magnet housing 222 form the support structure for Y direction electromagnetic motors. Similarly, electric coil plate 214 and magnet housing 224 form the support structure for an X direction electromagnetic motor. A control system (not shown) is coupled to each of Z electric coil arm 210 and the Y and X coil plates 212, 214 to position and propel chuck 110. Reticle 112 is restrained by chuck 110 and field 203 represents an illumination slit of actinic light on reticle 112. The X, Y, Z coordinate system is used by way of example, and not limitation. In this example, gravity pulls in the minus-Z direction, whereas the large scanning motion, propelled by external linear motors (not shown) coupled to frame 205 takes place along the Y axis.

As shown in FIGS. 2A and 2C, each of the Y and X magnet housings 222, 224 are coupled to the chuck 110 by a series of flexures 230. The flexures 230 serve three primary purposes. First, the flexures 230 serve to hold and constrain magnet housings 222 and 224. Such magnet housings have six degrees of freedom through which they must be contained—three translational degrees in the X, Y and Z directions, and three rotational degrees about the X, Y and Z axis, respectively. Second, the flexures 230 allow for expansion or contraction of the Y or X magnetic housing 222, 224. Finally, the flexures 230 thermally isolate magnet housings 222, 224 from chuck 110 by producing a high thermal resistance path. How the flexures 230 specifically work to constrain the magnet housings 222, 224 is further described below with reference to FIG. 4.

Figure 3A:
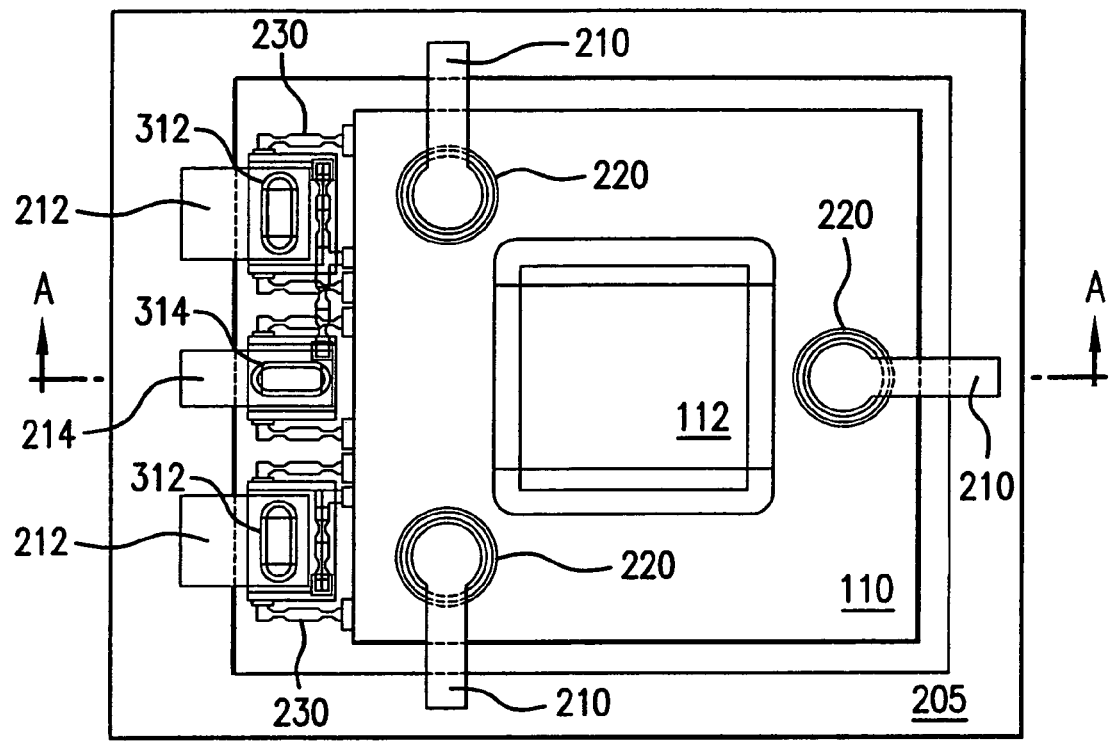
Figure 3B:
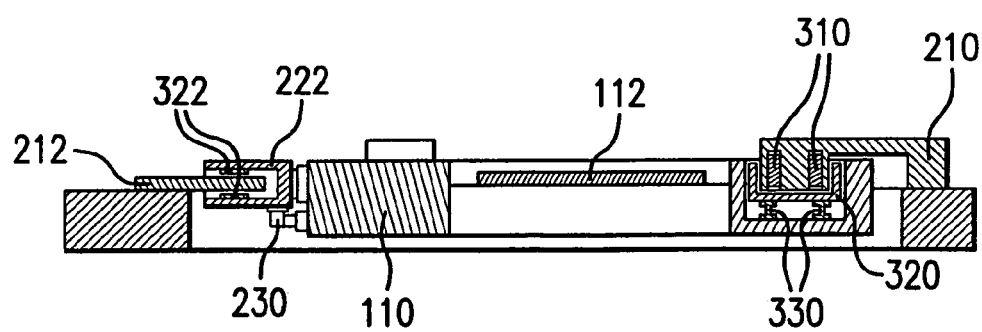

FIG. 3 more specifically illustrates how the electromagnetic motors are conventionally coupled and implemented between the chuck 110 and the frame 205. As shown in FIG. 3A, Y and X coil plates 212 and 214 are coupled to frame 205 and contain electric coils 312 and 314. As shown in FIG. 3B, Y magnet housing contains Y magnets 322. A similar arrangement (not shown) is used for the X magnets. The Z motor coil arm 210 contains Z electric coils 310. Magnetic cup 220 for the Z electromagnetic motor contains Z magnet 320, which is supported by Z magnet flexures 330. It is important to note that for the Z motor, a piece of ferromagnetic material could be substituted for Z magnet 320 because the only force needed is an attractive force to overcome gravity.

Figure 4A:
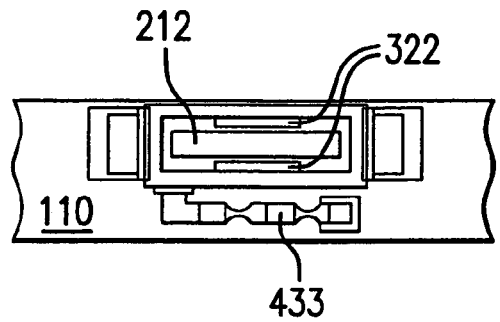
Figure 4B:
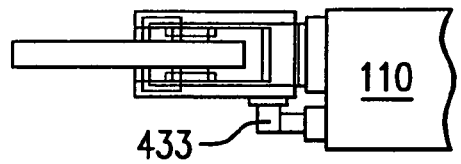
Figure 4C:
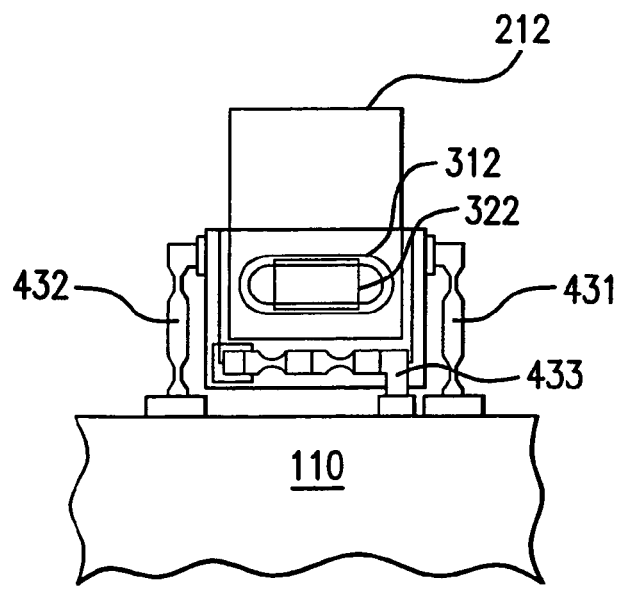

FIG. 4 more specifically illustrates a conventional flexure arrangement for coupling Y magnet housing 222 to chuck 110. The same principles apply to X magnet housing 224. Flexures 431, 432 and 433 together serve three primary purposes—(1) hold and constrain Y magnet housing 222; (2) allow for thermal expansion or contraction of Y magnet housing 222; and (3) and thermally isolate Y magnet housing 222 from chuck 110.

First, one skilled in the art will recognize that flexures 431 and 432 constrain Y magnet housing 222 translationally in the Y and Z directions, and rotationally about the Y and X axis. Flexure 433 constrains Y magnet housing 222 translationally in the X direction and rotationally about the Z axis. Second, proper operation of the electromagnetic motors requires close proximity between the magnets and the electric coils. As a scanning stage operates, the electric coil 312 heats up. This heat is transmitted to magnet 322 and to Y magnet housing 222. Flexure 431 and 432 allow for expansion or contraction in the X direction, while flexure 433 allows for expansion or contraction in the Y direction. Expansion in the Z direction is not compensated for, but its effects are generally negligible due to the smaller dimensions of the expanding parts in the Z direction. Finally, flexures 431, 432 and 433 serve to isolate the Y magnetic housing 222 from the chuck 110 by providing a high resistance thermal path to the chuck 110. This minimizes the heat transfer to the chuck 110, and the associated problems caused by thermal effects.

Figure 5A:
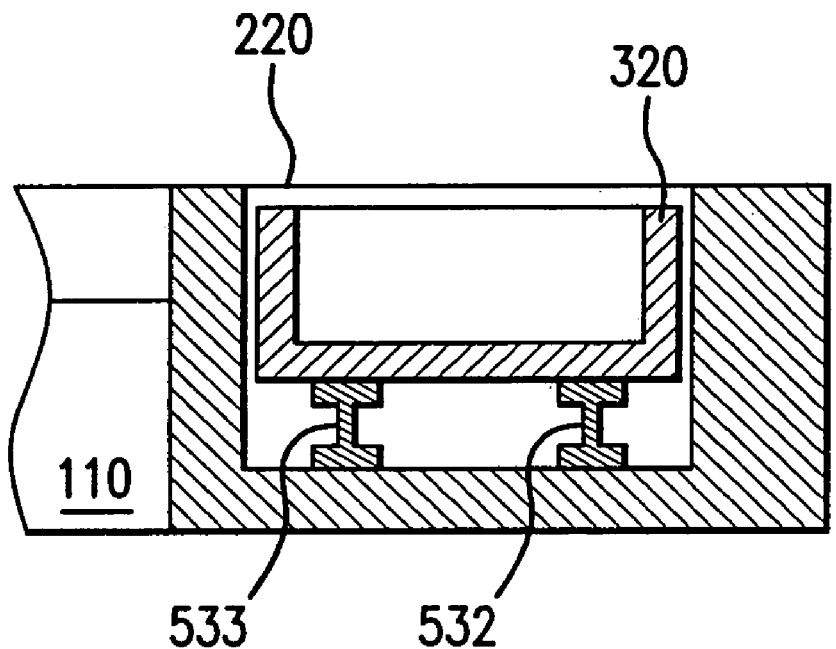
FIGS. 5A and 5B illustrate how a Z motor of a positioning apparatus is conventionally coupled to a chuck.
Figure 5B:
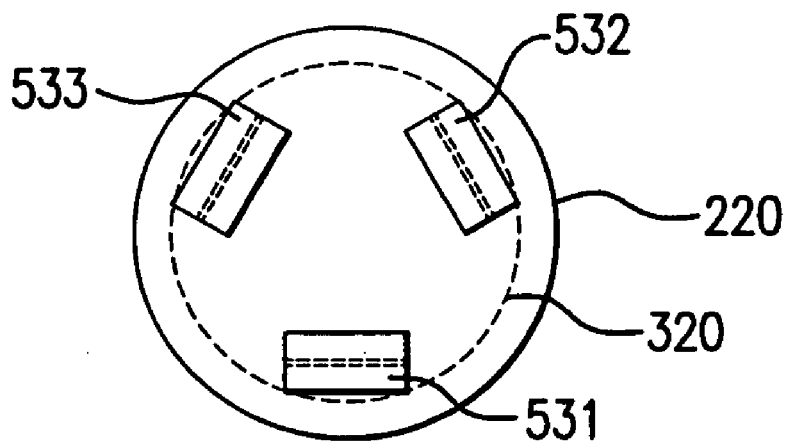

FIG. 5 illustrates the same principle for the Z electromagnetic motor. Flexures 531, 532 and 533 are positioned to allow for expansion of Z magnet 320 in the X and Y directions. No flexures are needed for expansion in the Z direction as expansion in the Z direction would not affect the position of the Z magnet 320.

As can be seen, a conventional apparatus for supporting and positioning a chuck in a lithography stage uses a plurality of flexures 230, 330 to couple the magnet portions 322, 320 of the electromagnetic motors to the chuck 110. These flexures add to the overall weight of the chuck 110 by approximately 10% or more. As noted above, added weight is propagated throughout the stage, resulting in increased costs and decreased throughput.

D. Foam Core Chuck

In the present invention, the chuck has a lightweight, foamed material for its core structure. A shell layer covers the structure giving the chuck a high specific stiffness. The result is a stiff, lightweight, foam core chuck with, a high thermal conductivity and a low mass, when compared to conventional solutions.

1. Material Properties

Table 1 provides a useful comparison of several well known materials such as stainless steel and aluminum, with potential chuck materials such as low expansion glass ceramics such as Zerodur®, and technical ceramics such as silicon carbide.

TABLE 1

Materials Properties Comparison Table

| Material | Density ρ [kg/m3] | Elastic Modulus E [Pa] | Specific Stiffness E/ρ [(m/s)2] [in millions] | Coefficient of Thermal Expansion α [ppm/K] | Thermal Conductivity k [W/m · K] | Thermal Stability k/α [W/m] |
|---|---|---|---|---|---|---|
| Metals | | | | | | |
| 303 Stainless Steel | 8,028 | 193,100 | 24.05 | 17.28 | 16.27 | 0.94 |
| 6061 Aluminum | 2,713 | 69,000 | 25.43 | 23.40 | 171.37 | 7.32 |
| Ultra-Low Expansion Glass/Ceramics | | | | | | |
| Zerodur (by Schott) | 2,530 | 93,800 | 37.08 | 0.02 | 1.64 | 82.00 |
| ULE 7971 (by Corning) | 2,201 | 67,600 | 30.71 | 0.02 | 1.32 | 66.00 |
| "Technical" Ceramics | | | | | | |
| Silicon Carbide (SiC) | 3,211 | 466,000 | 145.13 | 2.40 | 250.00 | 104.17 |
| Silicon Nitride | 3,267 | 296,500 | 90.76 | 2.00 | 27.70 | 13.85 |
| Aluminum Nitride | 3,260 | 300,000 | 92.02 | 4.30 | 110.00 | 25.58 |
| Foamed Materials | | | | | | |
| Silicon Carbide (SiC) | 30% SiC | 41,940 | 43.5 | 2.4 | 26.1 | 10.88 |

The features and advantages of the present invention will be better understood with an introduction to some of the parameters described above in Table 1. Specific stiffness is a measure of a materials rigidity divided by the materials density. An object's resonant frequencies or Eigen-frequencies are also directly related to the specific stiffness of its material. Specifically, resonant frequencies are proportional to the square root of specific stiffness.

In the context of chucks used in lithography tools, specific stiffness is a very important parameter with respect to the operating frequency of the control system. Objects in lithography tools are hypersensitive to vibration. If the frequency of the control system is at or above the lowest control actions applied at frequencies near the lowest eigen-frequency of the chuck, control-frequency-induced vibration could result. This frequency is known as the fundamental resonant frequency. For this reason, the bandwidth of the lithography tool control system is effectively somewhat less than the fundamental resonant frequency of the chucks. Typically, the chucks are critical limiting factors when choosing the frequency and bandwidth of a control system.

Control system bandwidth is directly limited by chuck fundamental resonant frequency, which is proportional to the square root of specific stiffness. Thus, doubling the specific stiffness of the chuck material will allow an increase in control bandwidth of about 1.4 times (1.4×). Likewise, if the specific stiffness of the chuck material is increased by a factor of four, then the control frequency could double. Therefore, it would be beneficial to have a chuck material with a high specific stiffness. Since a control system can only effectively correct external disturbances (for example transmitted floor vibrations) which have a frequency less than the control bandwidth, an increase in control bandwidth results in fewer uncorrected disturbances, which leads to better lithographic performance. In essence, high specific stiffness enables controls that can effectively suppress the detrimental effect of external disturbances on chuck positioning.

Specific stiffness is also reflective of an object's mass and weight. For instance, aluminum is not as stiff as stainless steel, but because it is much less dense, its specific stiffness is nearly the same as steel. Since rigidity, not strength is the prevailing requirement of a chuck, an exemplary aluminum chuck would resonate at about the same frequencies as a steel chuck of identical design, but weigh only about a third as much. In general, chucks made from materials with high specific stiffness can be lighter and still meet positioning requirements.

In the context of lithography tools, low weight is important because a common practice in the design of lithography tools is to isolate the chuck from sources of vibration, for example the floor. Typically, such isolation is accomplished by magnetically and/or hydrostatically (by means of an air bearing) levitating the chuck against the pull of gravity, in order to reduce the physical contact between it and the outside world as much as possible. Lighter chucks require less force to isolate and therefore less powerful levitation means, which cost less to make and operate. In the context of scanning lithography tools, where the chucks are scanned back and forth past a beam of light, low chuck mass also becomes important for achieving high production throughputs. In accomplishing the reciprocating motions of the reticle and wafer, which are typically found in scanning type tools, accelerating and decelerating force is provided by linear motors that drive the chucks. Heavier chucks require larger motors, which cost more to make and operate, and generate more heat.

Thermal conductivity is a measure of how efficiently heat is conducted by the material, while the coefficient of thermal expansion reflects the extent to which a material will expand as it is heated. These two properties combine to provide a measure of overall thermal stability, which is the thermal conductivity divided by the coefficient of thermal expansion. Certain properties of generally familiar metals, such as stainless steel and aluminum, are provided in Table 1 as reference points. As displayed in Table 1, stainless steel has a specific stiffness of 24.05 $(m/s)^2$, with a thermal conductivity of 16 W/m·K, where W is watts, m is meters, s is seconds and K is degrees Kelvin. Aluminum has a similar specific stiffness, but a much higher thermal conductivity of 171.37 W/m·K.

Conventionally, chucks used in lithography tools are crafted from materials that have an extremely low coefficient of thermal expansion. For example, conventional chucks are commonly made from ultra-low expansion glass/ceramics, such as ZERODUR® by Schott, or ULE 7971® by Corning. These glass/ceramics are characterized primarily by their extremely low thermal conductivity and extremely low coefficient of thermal expansion. Because these ultra-low expansion glass/ceramics are essentially impervious to thermal expansion, they obviate the need to compensate for thermal deformation of the chuck during lithographic operations. Nonetheless, ultra-low expansion glass/ceramics do have significant drawbacks.

First, their low specific stiffness limits the frequency, and thus the bandwidth, of the lithography tool's control system. Second, because of their low thermal conductivity, they are susceptible to localized heating and require a system of flexures to thermally isolate supporting magnets from the chuck body. Third, these materials are proprietary and thus very expensive. Finally, they are difficult to machine. Newer proprietary ceramic materials, such as Kyocera's Corderite 210®, having similarly low expansion to ZERODUR® and ULE® with slightly higher specific stiffness have been created, but their price may remain extremely high for the foreseeable future due a lack of supplier competition. Reliance on such proprietary, high cost, limited availability materials may be undesirable from a business point of view.

2. Foam Core Chuck According to the Present Invention

Figure 6A:
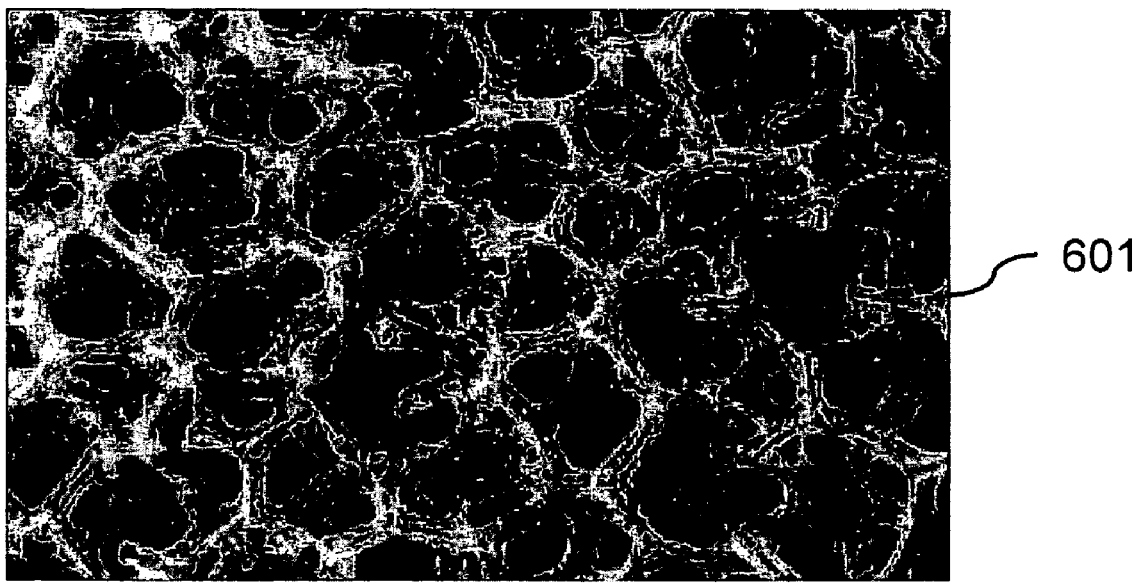
FIGS. 6A and 6B illustrate the foam core and shell layer of an embodiment of the invention.
Figure 6B:
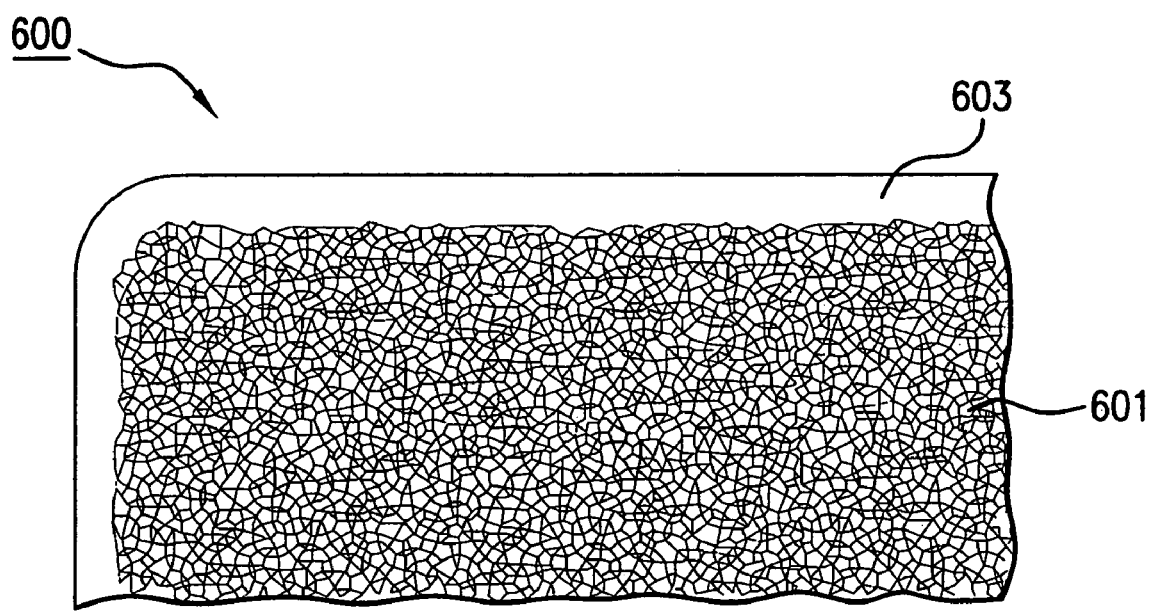

Chucks according to the present invention are fabricated from a class of generally non-proprietary foam materials. These materials exhibit a continuously connected, open-celled (reticulated) geometry, and usually having a duodecahedronal cell shape. A structure that is open-celled means that a fluid or a gas can pass through the structure. This is in contrast to a closed-cell foam structure, which can be imagined as grouping of bubble-like structures. FIG. 6 illustrates portion of a chuck according to the present invention. FIG. 6A, illustrates a foam core structure 601. In FIG. 6A, interstitial branches are white or gray in color, while the spaces are black; the reverse is true in FIG. 6B.

In a preferred embodiment, the foam core structure 601 is silicon carbide. The invention, however, is not limited to silicon carbide foam as other foam structures exist, such as aluminum foam. Silicon carbide is often referred to as a "technical ceramic" or an "advanced ceramic." The physical properties of some technical ceramics have the characteristics shown in Table 1. The relationship between the physical properties of the parent solid material to the brittle foams formed therefrom depends on the density of the foam core structure. For example, for silicon carbide, the elasticity of the foam core structure is:

$$E_f \approx E_s \left(\frac{\rho_f}{\rho_s}\right)^2$$

where $E_f$ is the elasticity of the silicon carbide foam, $E_s$ is the elasticity of the solid silicon carbide, $\rho_f$ is the density of the foam core structure and $\rho_s$ is the density of the solid silicon carbide.

Likewise, the thermal conductivity of a silicon carbide foam core structure is:

$$C_f \approx (.348) C_s \left(\frac{\rho_f}{\rho_s}\right)$$

where $C_f$ is the thermal conductivity of the silicon carbide form core, $C_s$ is the thermal conductivity of the solid silicon carbide, $\rho_f$ is the density of the foam core structure and $\rho_s$ is the density of the solid Silicon carbide. For silicon carbide foam structure, the coefficient of thermal expansion (CTE) is identical to the parent solid material.

Various known manufacturing techniques can vary the density of the foam core structure 601, either by making the interstitial branches thicker, or by making the open space between the interstitial branches smaller. Typical densities range from approximately 8% to 30% solid. Such densities result in a concomitant reduction in weight over the solid parent material. For example, a silicon carbide foam that has a density of 20% will weigh only 20% of a solid block of silicon carbide of the same size. One manufacturer of foamed materials is ERG Materials and Aerospace Corporation located at 900 Stanford Ave., Oakland, Calif. 94608.

FIG. 6B illustrates a shell layer 603 that is formed over a portion of the foam core structure 601. The shell layer 603 can be formed by chemical vapor deposition or other techniques known in the art. In one embodiment, the shell layer 603 is solid silicon carbide. Forming shell layer 603 from silicon carbide sheets is advantageous because by using the same material as the foam, stress at the interface between the shell layer 603 and the foam core 601 can be avoided. In a alternative embodiment, the shell layer 603 can be composed of an ultra-low glass ceramic, such as Zerodur®. Zerodur® can be bonded directly to silicon carbide foam without excessively distorting the Zerodur®, in spite of the 2.2 PPM/degree Celsius coefficient of thermal expansion (CTE) mismatch. The reason is that even though the specific stiffness of silicon carbide foam is greater than that of Zerodur®, the actual stiffness is substantially less. Therefore, at the interface between the two materials, the solid Zerodur® sheet controls expansion and the silicon carbide foam experiences nearly all the thermal strain. Covering the foam core structure 601 with a shell layer 603 increases the stiffness and stability of the chuck 600 such that it can be used in step and scan lithography systems.

Fabrication of foam core chucks 600 from, for example, silicon carbide foam results in a number of significant benefits to the lithography stage. First, and most importantly, the weight of the chuck 600 is reduced. Motors, actuators, balance masses and frames 205 can be made lighter as a result. Moreover, as described below, a foam core chuck 600 can eliminate the flexures 230 that conventional chucks 110 require to couple the magnet portions 320, 322 of the electromagnetic positioning apparatus. A significant limitation on product throughput lies in the time it takes to dynamically scan a chuck 600 back and forth during lithography. With a lighter chuck 600, the accelerating and decelerating forces necessary to move the chuck are less, allowing speed to be increased, power consumption to be decreased, and overall heat generation to be less.

Second, silicon carbide foam has a thermal conductivity nearly 16 times that of ZERODUR® or ULE 7971®, while the solid silicon carbide thermal conductivity is nearly 200 times that of the ultra-low glass ceramics. A high thermal conductivity allows precise measurement or prediction of thermal expansion, thus allowing for precise correction within the tolerances allowed by modern semiconductor fabrication geometries. In essence, while low thermal expansion remains desirable, high thermal conductivity becomes important so that following a thermal perturbation, the object quickly reaches internal thermal equilibrium and a uniform temperature. Thus, thermal strain becomes uniform rather than localized, and it is less relevant how or where on the object expansion is measured.

Third, the increased specific stiffness results in a greater control system bandwidth. As can be seen in Table 1, silicon carbide foam has a 15% greater specific stiffness than ZERODUR®. As noted above, the allowable control bandwidth or frequency of a lithography tool is proportional to the square root of the specific stiffness of the chuck material. Thus, using silicon carbide foam core chucks, would yield roughly a 4% increase in the control bandwidth of a lithography tool over those using conventional chucks made from ZERODUR® or ULE 7971®.

The addition of shell layer 603 significantly increases the specific stiffness of chuck 600. This is especially true in a bending resonance mode, because the chuck 600 is constructed like and I-Beam, with most of the mass being at the top and bottom surfaces (i.e., the solid shell layer 603 at the top and bottom of chuck 600). The I-Beam-like construction of chuck 600 thus greatly increases the specific stiffness in the bending resonance mode.

Another important resonance mode is a torsional mode. Chuck 600 is also stiff in a torsion mode. Under a heavy torsional load, a hollow shell structure with high aspect ratio cross section, like a chuck, would tend to buckle and collapse, leading to a catastrophic torsional failure. More importantly for a chuck, even in the absence of an applied torsional load, the structure would tend have a low torsional resonant frequency. However, as long as the foam core structure 601 provides a sufficient rigidity between the shells layers 603 to prevent a torsional micro-collapse, the torsional resonant frequency may be increased.

In sum, the combination of the foam core structure 601 covered by shell layer 603 is a mass effective way to both lower the weight of chuck 600 and increase the specific stiffness of chuck 600. This structure provides a moderate advantage in general, and a very large advantage particularly with respect to bending and torsional resonant modes, which tend to be the dominant (lowest frequency) modes in chucks.

Figure 7A:
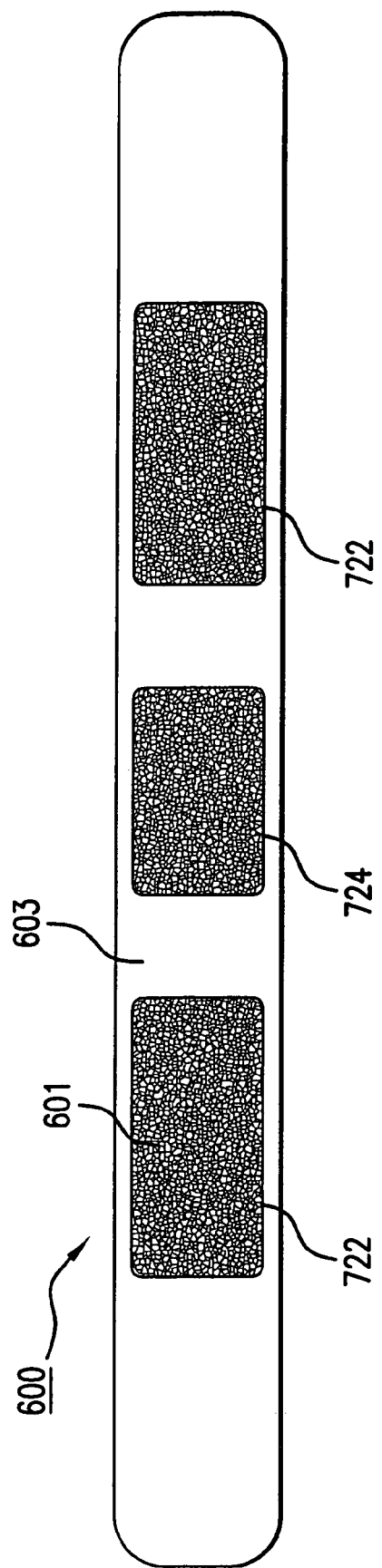
Figure 7B:
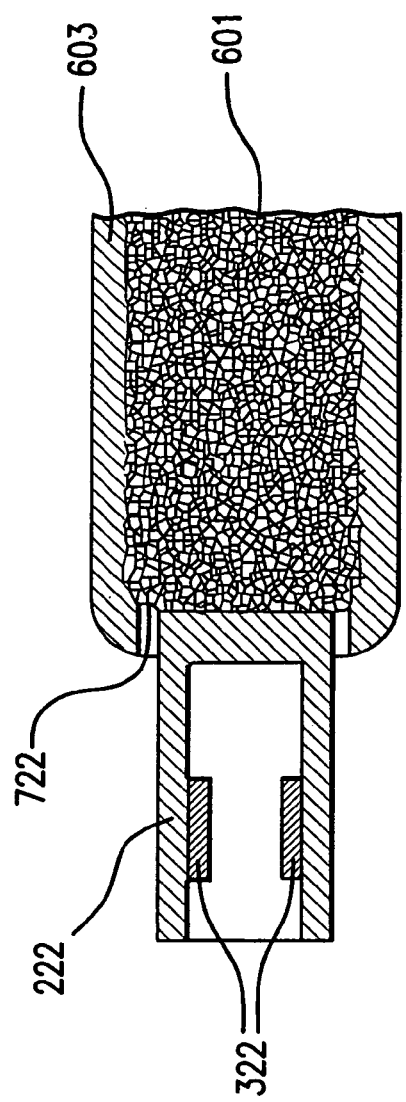
Figure 7C:
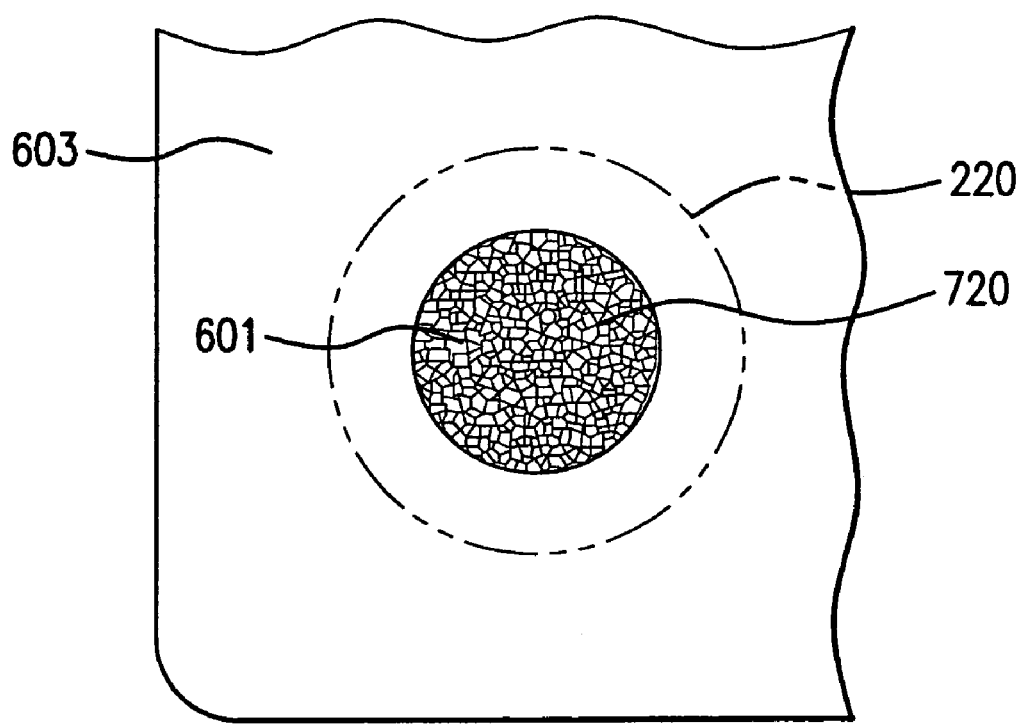
Figure 7D:
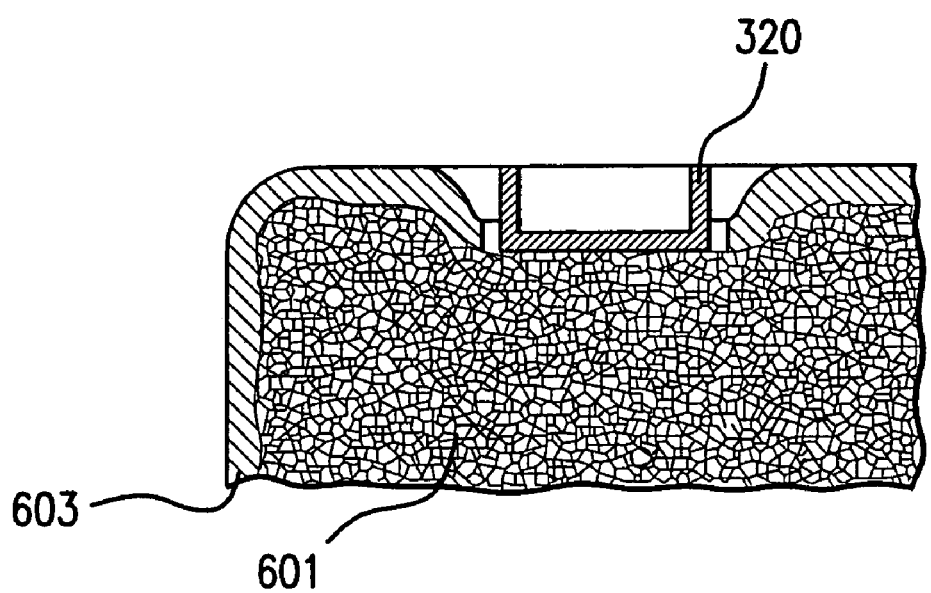

E. Apparatus for Supporting and Positioning a Foam Core Chuck in a Lithography Tool FIG. 7 illustrates a chuck 600 with Y magnet housing 222 and Z magnet 320 for supporting and positioning the chuck 600 according to the present invention. FIG. 7A illustrates a chuck 600 having portions 722, 724 and 720 of the foam core structure 601 exposed beneath shell layer 603. The portion labeled 722 is where Y magnet housing 222 can be attached directly to the foam core structure 601; the portion labeled 724 is where X magnet housing 224 can be attached directly to foam core structure 601. FIG. 7B illustrates how a Y magnet housing 222 is attached directly to foam core structure 601. The same principle applies to X magnet housing 224. FIG. 7C illustrates an exposed portion 720 of foam core structure 601 where a Z magnet 320 can be attached directly to foam core structure 601. FIG. 7D illustrates how Z magnet 320 is directly attached to foam core structure 601.

One skilled in the art would recognize a variety of methods for attaching the Y and X magnet housings 222, 224, and the Z magnet 320 directly to the foam core structure 601. In a preferred embodiment, the surfaces to be joined are carefully prepared such that they have a sufficient degree of flatness, roughness, and cleanliness. Then, a thin layer of high strength epoxy is used to bind the surfaces together.

The unique characteristics of the foam core structure allows the Y and X magnet housings 222, 224, and the Z magnet 320 to be directly attached to the foam core structure 601 without the need for conventional flexures. This is because each of the interstitial branches that bond to the housing or magnet acts as a miniature flexure. When acting in concert across the surface of the housing or magnet, the bond acts as a distributed flexure, locally distributing any thermal stress directly to interstitial branches of the foam core structure ("flexure effect"). One skilled in the art will recognize that this stress will not propagate far beyond the bond site to the rest of the foam core chuck 600. In this fashion, the need for weighty flexures is eliminated, further reducing the weight of the chuck 600. Furthermore, due to the extremely large surface area per unit volume of the foam, convective air cooling very effectively and rapidly dissipates heat produced by the magnet, preventing it from traveling into the structure to any significant depth ("heat sink effect"). The thermal as well as the mechanical disturbances due to magnet heating are thus practically confined within a fairly thin volume of foam adjacent to the magnet.

Figure 8C:
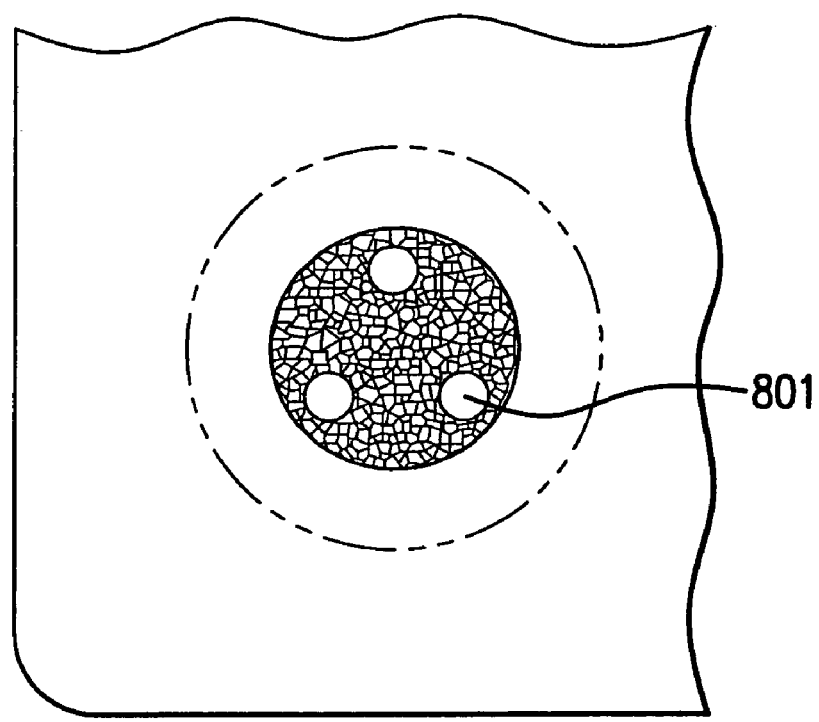
Figure 8D:
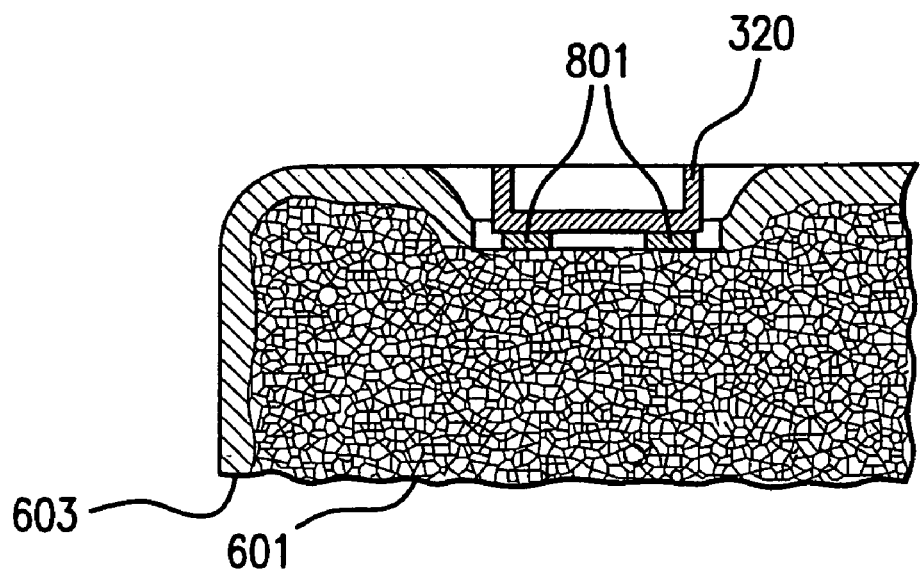

FIG. 8 illustrates an alternative embodiment of the present invention. In one embodiment, bond pad 801 is a portion of the shell layer 603 that remains on the foam core structure 601 and is isolated from the shell layer 603. Instead of attaching a magnet housing such as Y magnet housing 222 or a magnet such as Z magnet 320 directly to the foam core structure 601, the magnet housing or magnet is instead coupled to the foam core structure 601 by a plurality of bond pads 801. For example, in FIG. 8B, Y magnet housing 222 is coupled to the foam core structure 601 of chuck 600 by the three bond pads 801 depicted in portion 722 of FIG. 8A. Likewise, in FIG. 8D, Z magnet 320 is coupled to the foam core structure 601 of chuck 600 by the three bond pads 801 depicted in portion 720 of FIG. 8C. It is important to note that the bond pads 801 do not have the be of the same material as the shell layer 603. Nor is the invention limited to three bond pads, or the pad shapes illustrated.

Bond pads 801 act like the distributed flexure described above with respect to FIG. 7. Each of the interstitial branches that attach to the bond pad 801 acts as a miniature flexure. When acting in concert across the surface of the bond pad 801 attached to the foam core structure 601, the attachment acts as a distributed flexure, locally distributing any thermal stress directly to interstitial branches of the foam core structure. One skilled in the art will recognize that this stress will not propagate far beyond the local attachment site to the rest of the foam core chuck 600 due to the flexure effect of the foam. Likewise, heat will not propagate to the rest of the foam core chuck 600 due to the heat sink effect of the foam. As where the magnet housing or magnet are attached directly to the foam core structure 601, the need for weighty flexures is eliminated.

FIG. 9 illustrates yet another use for the foam core material 601. FIG. 9 illustrates how a piece of foam core structure 901 can be used as a distributed flexure. In FIG. 9A, Y magnet housing 222 is coupled to the shell layer 603 of chuck 600 with a piece of foam core material 901. The piece of foam core material 901 acts as a distributed flexure as described above. The advantage is that the piece of foam core material 901 is lighter and simpler than the system of flexures 431, 432 and 433 described with respect to FIG. 4. Similarly, in FIG. 9B, Z magnet 320 is coupled to the shell layer 603 of chuck 600 with a piece of foam core structure 901. Finally, in FIG. 9C, Z magnet 320 is coupled to a conventional chuck 110 using a piece of foam core material 901. The invention is not limited to any particular shape or thickness of foam core structure 901. One skilled in the art could vary these parameters according to the physical requirements necessary to support the chuck 110 or 600 in the lithography too. Moreover, the foam core material 901 is not limited to the exact same material as the chuck 110 itself.

F. Method for Making a Foam Core Chuck

FIG. 10 is a flowchart illustrating a method for a making a chuck 600 according to the present invention. In step 1005, a foam core structure 601 is formed. Foamed materials are commercially available. In a preferred embodiment, the foam core structure 601 is silicon carbide. Other foamed materials include aluminum and reticulated vitreous carbon.

Next, in step 1010, a shell layer 603 is formed on the foam core structure 601. The shell layer 603 may be formed by know processes such as chemical vapor deposition or chemical vapor infusion. The shell layer 601 can be the same as the core material, or may be of a different material. In a preferred embodiment, the shell layer 603 is a solid sheet of silicon carbide. In another embodiment, an ultra-low expansion glass ceramic can be used for the shell layer 601.

In step 1015, a region of the foam core structure 601 is exposed. This can be accomplished by milling away part of the shell layer 603 until the foam core structure 601 beneath is exposed. Alternatively, the shell layer 603 can be preferentially deposited over the foam core structure 601, thus leaving selected portions of the foam core structure exposed.

Finally, a positioning apparatus is coupled to the exposed region of the foam core structure. The positioning apparatus is typically an electromagnetic device, such as an electromagnetic motor. As explained above, there are various means by which portions of the electromagnetic motor may be coupled to the foam core structure 601. When portions of the motor, such as the magnets, are coupled to the foam core structure 601, the foam core structure 601 acts like a distributed flexure, thus eliminating the need for conventional flexures 230.

G. Conclusion

While various embodiments of the present invention have been described above, it should be understood that they have been presented by way of example only, and not limitation. It will be understood by those skilled in the relevant art(s) that various changes in form and details may be made therein without departing from the spirit and scope of the invention as defined in the appended claims. Accordingly, the breadth and scope of the present invention should not be limited by any of the above-described exemplary embodiments, but should be defined only in accordance with the following claims and their equivalents.

What is claimed is:

1. A lithography stage, comprising:
   a frame;
   a chuck supported by said frame, said chuck having a foam core structure covered by a shell layer; and
   an electromagnetic device for supporting and positioning said chuck, said electromagnetic device having at least one coil coupled to said frame and at least one magnet coupled to said foam core structure of said chuck;
   wherein said foam core structure acts as a distributed flexure for said magnet.

2. The lithography stage of claim 1, wherein said foam core structure is a silicon carbide foam.

3. The lithography stage of claim 1, wherein said shell layer comprises a layer of silicon carbide.

4. The lithography stage of claim 1, wherein said shell comprises a layer of glass-ceramic material having a low coefficient of thermal expansion.

5. The lithography stage of claim 1, wherein said magnet is attached directly to said foam core structure.

6. The lithography stage of claim 1, wherein said magnet is disposed in a housing attached directly to said foam core structure.

7. The lithography stage of claim 6, wherein said housing is coupled to said foam core structure by a plurality of bond pads, wherein said bond pads are located on said foam core structure and isolated from said shell layer.

8. The lithography stage of claim 7, wherein said bond pads are formed from said shell layer.

9. The lithography stage of claim 1, wherein said magnet is coupled to said foam core structure by plurality of bond pads, wherein said bond pads are located on said foam core structure and isolated from said shell layer.

10. The lithography stage of claim 9, wherein said bond pads are formed from said shell layer.

11. A method for making a chuck that supports a workpiece in a lithographic stage having a positioning apparatus, comprising:
    (a) forming a foam core structure;
    (b) forming a shell layer on said foam core structure;
    (c) exposing a portion of said foam core structure; and
    (d) coupling said exposed region of said foam core structure to the positioning apparatus, wherein said exposed region of said foam core structure acts as a distributed flexure for the positioning apparatus.

12. The method of claim 11, wherein said foam core structure is silicon carbide foam.

13. The method of claim 11, wherein said shell layer is silicon carbide.

14. The method of claim 11, wherein said shell layer is glass-ceramic material having a low coefficient of thermal expansion.

15. The method of claim 11, wherein step (d) comprises attaching a portion of the positioning apparatus directly to said exposed region of said foam core structure.

16. The method of claim 15, wherein said attached portion of the positioning apparatus is a magnet portion of an electromagnetic motor.

17. The method of claim 15, wherein said attached portion of the positioning apparatus is a housing for holding said magnet portion of said electromagnetic motor.

18. The method of claim 11, wherein step (c) comprises exposing a region of said foam core structure such that at least one bond pad of said shell layer remains in said exposed region, said bond pad being isolated from said shell layer.

19. The method of claim 18, wherein step (d) comprises attaching a portion of the positioning apparatus directly to said bond pad.

20. The method of claim 19, wherein said attached portion of the positioning apparatus is a magnet portion of an electromagnetic motor.

21. The method of claim 19, wherein said attached portion of the positioning apparatus is a housing for holding said magnet portion of said electromagnetic motor.

22. A lithography stage, comprising:
a frame;
a chuck supported by said frame; and
an electromagnetic device for supporting and positioning said chuck, said electromagnetic device having at least one coil coupled to said frame and at least one magnet coupled to said chuck, wherein said magnet is coupled to said chuck using a silicon carbide foam structure as a distributed flexure.

23. The lithography stage of claim 22, wherein said magnet is disposed in a housing that is attached to said silicon carbide foam structure.

24. The lithography stage of claim 22, wherein said magnet is attached to said silicon carbide foam structure.

* * * * *

UNITED STATES PATENT AND TRADEMARK OFFICE
CERTIFICATE OF CORRECTION

PATENT NO. : 7,009,359 B2 Page 1 of 1
APPLICATION NO. : 10/636548
DATED : March 7, 2006
INVENTOR(S) : Santiago E. del Puerto It is certified that error appears in the above-identified patent and that said Letters Patent is hereby corrected as shown below:

In column 14, line 20, "by plurality" should be replaced with --by a plurality--; and In column 14, line 51, "holding said" should be replaced with --holding a--.

Signed and Sealed this

Twenty-sixth Day of June, 2007

JON W. DUDAS
*Director of the United States Patent and Trademark Office*